United States Patent
Hwang et al.

(10) Patent No.: US 11,873,424 B2
(45) Date of Patent: Jan. 16, 2024

(54) TAPE MEMBER AND ELECTRONIC APPARATUS INCLUDING SAME

(71) Applicant: Samsung Electronics Co., Ltd., Gyeonggi-do (KR)

(72) Inventors: Daum Hwang, Gyeonggi-do (KR); Sangin Baek, Gyeonggi-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 511 days.

(21) Appl. No.: 17/262,806

(22) PCT Filed: May 29, 2019

(86) PCT No.: PCT/KR2019/006442
§ 371 (c)(1),
(2) Date: Jan. 25, 2021

(87) PCT Pub. No.: WO2020/054943
PCT Pub. Date: Mar. 19, 2020

(65) Prior Publication Data
US 2021/0309901 A1    Oct. 7, 2021

(30) Foreign Application Priority Data
Sep. 10, 2018  (KR) ........................ 10-2018-0107616

(51) Int. Cl.
*C09J 183/04*    (2006.01)
*B32B 7/12*    (2006.01)
(Continued)

(52) U.S. Cl.
CPC ............... *C09J 183/04* (2013.01); *B32B 7/12* (2013.01); *B32B 27/08* (2013.01); *C09J 175/04* (2013.01);
(Continued)

(58) Field of Classification Search
None
See application file for complete search history.

(56) References Cited

U.S. PATENT DOCUMENTS 10,091,869 B1 * 10/2018 Chien ..................... H05K 3/321
2011/0013368 A1 * 1/2011 Nagaike ............... H05K 9/0032
361/728

(Continued)

FOREIGN PATENT DOCUMENTS

JP    2006-351676 A    12/2006
JP    2009-029935 A    2/2009
(Continued)

OTHER PUBLICATIONS

Korean Office Action dated Nov. 21, 2022.

*Primary Examiner* — Xanthia C Cunningham
(74) *Attorney, Agent, or Firm* — Cha & Reiter, LLC

(57) ABSTRACT

According to various embodiments, an electronic apparatus comprises: a housing including a first plate, a second plate facing in the opposite direction as the first plate, and side members surrounding the space between the second plate and the second plate; a printed circuit board which is disposed within the space and on which at least one electrical component is mounted; a shield can mounted on the printed circuit board and disposed to surround the at least one electrical component; and an insulating tape member attached to the inner surface of the shield can between the shield can and the electrical component. The insulating tape member may include: a first layer including a first material and formed to a first thickness; a second layer laminated on the first layer by means of an adhesive, including a second material, and formed to a second thickness that is the same as or thicker than the first thickness; and an adhesive layer
(Continued)

formed on the second layer and for being attached to the shield can. Various other embodiments may also be possible.

15 Claims, 11 Drawing Sheets

(51) Int. Cl.
    *B32B 27/08*     (2006.01)
    *C09J 175/04*     (2006.01)
    *H05K 5/00*     (2006.01)
    *H05K 9/00*     (2006.01)

(52) U.S. Cl.
    CPC ......... *H05K 5/0017* (2013.01); *H05K 9/0024* (2013.01); *B32B 2405/00* (2013.01); *B32B 2457/08* (2013.01); *B32B 2457/208* (2013.01)

(56) References Cited

U.S. PATENT DOCUMENTS

| | | |
|---|---|---|
| 2014/0048199 A1 | 2/2014 | Kim et al. |
| 2015/0030878 A1 | 1/2015 | Zhi |
| 2015/0200479 A1 | 7/2015 | Rhee |
| 2015/0343750 A1 | 12/2015 | Lin et al. |
| 2016/0243817 A1 | 8/2016 | Roh |
| 2017/0217143 A1* | 8/2017 | Kim .................. B32B 27/32 |
| 2018/0131087 A1 | 5/2018 | Kim et al. |
| 2018/0134022 A1* | 5/2018 | Kim .................. B32B 38/18 |
| 2019/0043779 A1 | 2/2019 | Chung et al. |

FOREIGN PATENT DOCUMENTS

| | | |
|---|---|---|
| JP | 2013-30421 A | 2/2013 |
| JP | 2015-523709 A | 8/2015 |
| JP | 2018-056329 A | 4/2018 |
| KR | 10-2014-0023820 A | 2/2014 |
| KR | 10-1458742 B1 | 11/2014 |
| KR | 10-1487137 B1 | 1/2015 |
| KR | 10-2015-0028458 A | 3/2015 |
| KR | 10-2015-0084106 A | 7/2015 |
| KR | 10-2015-0120979 A | 10/2015 |
| KR | 10-2017-0100975 A | 9/2017 |
| KR | 10-2018-0051173 A | 5/2018 |

* cited by examiner

TAPE MEMBER AND ELECTRONIC APPARATUS INCLUDING SAME

CROSS-REFERENCE TO RELATED APPLICATION(S)

This application is a National Phase Entry of PCT International Application No. PCT/KR2019/006442, which was filed on May 29, 2019 and claims priority to Korean Patent Application No. 10-2018-0107616, which was filed on Sep. 10, 2018, the contents of which are incorporated herein by reference.

TECHNICAL FIELD

Various embodiments of the disclosure relate to a tape member and an electronic device including the same.

BACKGROUND ART

Electronic devices are gradually becoming smaller, whereas their functions are gradually diversifying. As electronic devices become slimmer and smaller, an area in which a metal member is disposed to reinforce rigidity may be increased, which may cause a malfunction due to an electrical short with surrounding electric elements. Accordingly, the electronic devices may require an improved scheme of insulating a metal structure from surrounding electric elements.

DISCLOSURE OF INVENTION

Technical Problem

In the electronic device, many electric elements may be disposed to support various functions, and the spacing between the electric elements may become narrowing to meet a slimmer and smaller trend of the electronic device. Thus, an area where an insulating tape member is arranged for insulation between such electric elements is increasing, and efforts are being made to apply the arrangement of the insulating tape member to an automated process.

The insulating tape member may be formed as a thin film, and may be transferred to an arrangement position in the electronic device by a pickup machine using a pneumatic pressure for an automated process. If only the insulating tape member itself is picked up, the insulating tape member may be deformed due to its thin thickness and weak rigidity. Therefore, the insulating tape member may be transferred with a thick release paper attached, so that a separate process may be required to remove the release paper after the insulating tape member is attached to a corresponding portion of the electronic device. In addition, when the release paper is removed, the insulating tape member may be peeled off together. Thus, inspection and management may be required such that the release paper does not remain as a foreign material inside the electronic device.

Various embodiments of the disclosure can provide a tape member and an electronic device including the same.

Various embodiments of the disclosure can provide a tape member for an automated process and an electronic device including the same.

Solution to Problem

According to various embodiments, an electronic device may comprise a housing including a first plate, a second plate facing in an opposite direction to the first plate, and a lateral member surrounding a space between the first plate and the second plate; a printed circuit board (PCB) disposed in the space and having at least one electric element mounted thereon; a shield can mounted on the PCB and disposed to surround at least in part the at least one electric element; and an insulating tape member attached to an inner surface of the shield can between the shield can and the electric element. The insulating tape member may include a first layer containing a first material and formed to have a first thickness, a second layer laminated on the first layer with an adhesive, containing a second material, and formed to have a second thickness equal to or greater than the first thickness, and an adhesive layer formed on the second layer and attached to the shield can.

According to various embodiments, an electronic device may comprise a housing including a first plate, a second plate facing in an opposite direction to the first plate, and a lateral member surrounding a space between the first plate and the second plate; at least one electric element disposed in the space; a metal structure disposed around the at least one electric element in the space; and an insulating tape member attached to the metal structure between the at least one electric element and the metal structure. The insulating tape member may include a first layer containing a first material and formed to have a first thickness, a second layer laminated on the first layer with an adhesive, containing a second material, and formed to have a second thickness equal to or greater than the first thickness, and an adhesive layer formed on the second layer and attached to the metal structure.

According to various embodiments, an electronic device may comprise a housing including a first plate and a second plate facing in an opposite direction to the first plate; a printed circuit board (PCB) disposed in the housing and having a first surface; at least one electronic component mounted on the first surface of the PCB; a conductive shield structure mounted on the first surface of the PCB to cover the electronic component while being spaced apart from the electronic component, and having a second surface facing the first surface; and an insulating member disposed between the second surface and the electronic component and attached to the second surface. The insulating member may include, in a direction from the second surface toward the first surface, a first adhesive layer, a first polyimide film layer having a first thickness, a second adhesive layer, and a second polyimide film layer having a second thickness. The first thickness may be equal to or greater than the second thickness.

Advantageous Effects of Invention

According to various embodiments of the disclosure, because the rigidity of a tape member is increased through a laminated structure without an increase in thickness, a process of separating a release paper is not required when the tape member is applied to an electronic device. Therefore, a manufacturing process step is reduced, and it is advantageous to an automated process.

BRIEF DESCRIPTION OF DRAWINGS

In the drawings, the same or similar reference numerals may be used for the same or similar components.

MODE FOR THE INVENTION

Figure 1:
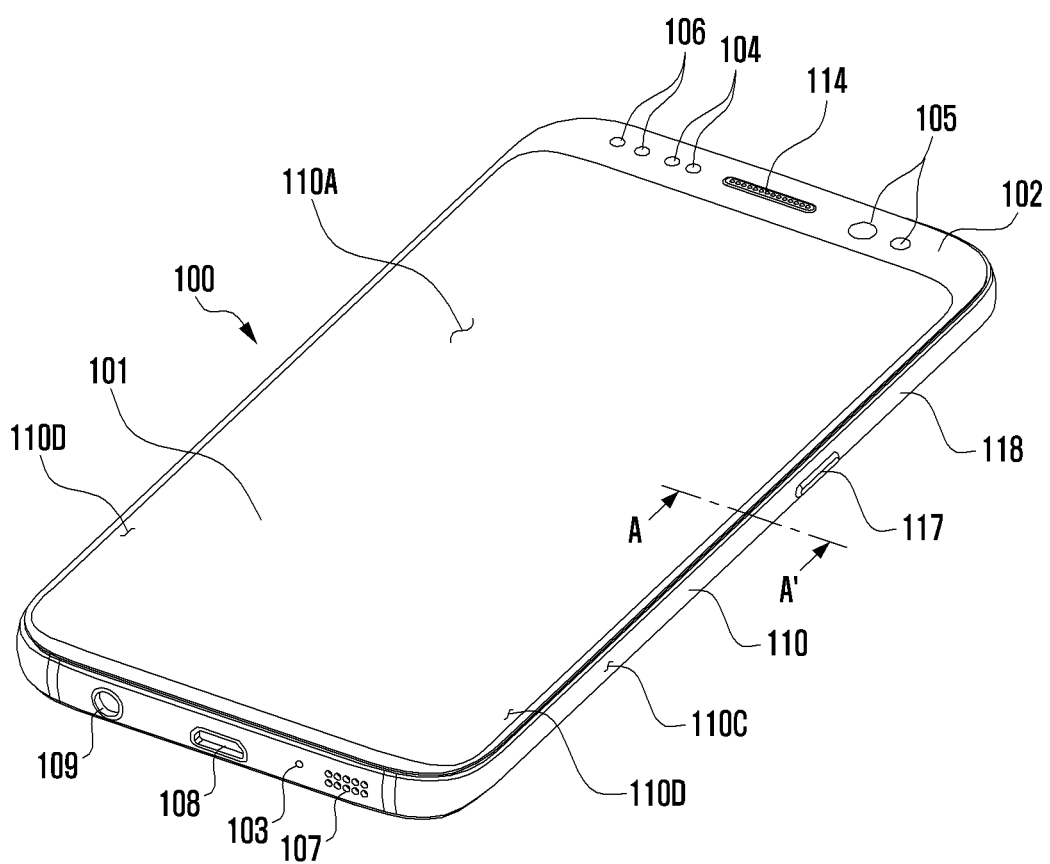
FIG. 1 is a perspective view illustrating a front surface of a mobile electronic device according to various embodiments of the disclosure.
Figure 2:
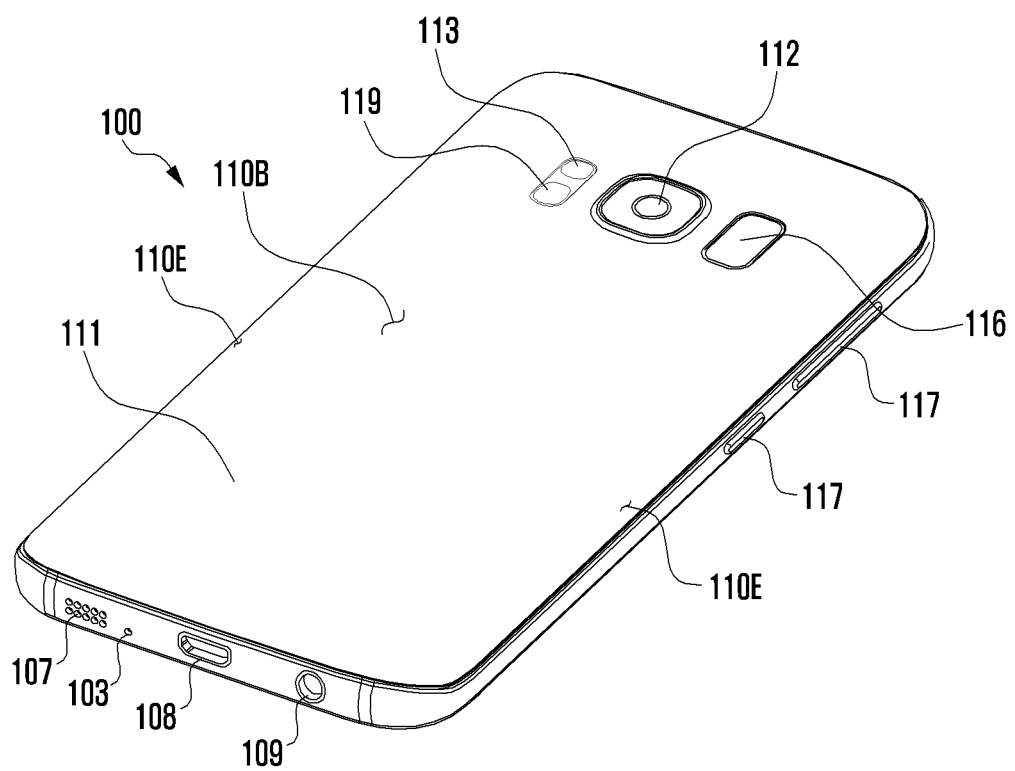
FIG. 2 is a perspective view illustrating a rear surface of the electronic device of FIG. 1 according to various embodiments of the disclosure.

FIG. 1 illustrates a perspective view showing a front surface of a mobile electronic device according to an embodiment of the disclosure, and FIG. 2 illustrates a perspective view showing a rear surface of the mobile electronic device shown in FIG. 1 according to an embodiment of the disclosure.

Referring to FIGS. 1 and 2, a mobile electronic device 100 may include a housing 110 that includes a first surface (or front surface) 110A, a second surface (or rear surface) 110B, and a lateral surface 110C that surrounds a space between the first surface 110A and the second surface 110B. The housing 110 may refer to a structure that forms a part of the first surface 110A, the second surface 110B, and the lateral surface 110C. The first surface 110A may be formed of a front plate 102 (e.g., a glass plate or polymer plate coated with a variety of coating layers) at least a part of which is substantially transparent. The second surface 110B may be formed of a rear plate 111 which is substantially opaque. The rear plate 111 may be formed of, for example, coated or colored glass, ceramic, polymer, metal (e.g., aluminum, stainless steel (STS), or magnesium), or any combination thereof. The lateral surface 110C may be formed of a lateral bezel structure (or "lateral member") 118 which is combined with the front plate 102 and the rear plate 111 and includes a metal and/or polymer. The rear plate 111 and the lateral bezel structure 118 may be integrally formed and may be of the same material (e.g., a metallic material such as aluminum).

The front plate 102 may include two first regions 110D disposed at long edges thereof, respectively, and bent and extended seamlessly from the first surface 110A toward the rear plate 111. Similarly, the rear plate 111 may include two second regions 110E disposed at long edges thereof, respectively, and bent and extended seamlessly from the second surface 110B toward the front plate 102. The front plate 102 (or the rear plate 111) may include only one of the first regions 110D (or of the second regions 110E). The first regions 110D or the second regions 110E may be omitted in part. When viewed from a lateral side of the mobile electronic device 100, the lateral bezel structure 118 may have a first thickness (or width) on a lateral side where the first region 110D or the second region 110E is not included, and may have a second thickness, being less than the first thickness, on another lateral side where the first region 110D or the second region 110E is included.

The mobile electronic device 100 may include at least one of a display 101, input device 103, acoustic output devices 107 and 114, sensor modules 104 and 119, camera modules 105, 112 and 113, a key input device 117, a indicator 106, and connectors 108 and 109. The mobile electronic device 100 may omit at least one (e.g., the key input device 117 or the indicator 106) of the above components, or may further include other components.

The display 101 may be exposed through a substantial portion of the front plate 102, for example. At least a part of the display 101 may be exposed through the front plate 102 that forms the first surface 110A and the first region 110D of the lateral surface 110C. The display 101 may be combined with, or adjacent to, a touch sensing circuit, a pressure sensor capable of measuring the touch strength (pressure), and/or a digitizer for detecting a stylus pen. At least a part of the sensor modules 104 and 119 and/or at least a part of the key input device 117 may be disposed in the first region 110D and/or the second region 110E.

The input device 103 may include microphone 103. The microphone 103 may contain a plurality of microphones to sense a sound direction. The acoustic output devices 107 and 114 may be include speakers 107 and 114. The speakers 107 and 114 may be classified into an external speaker 107 and a call receiver 114. The microphone 103 and the speakers 107 and 114 and connectors 108 and 109 may be implemented as a single hole, or a speaker (e.g., a piezo speaker) may be provided without the speaker holes 107 and 114.

The sensor modules 104 and 119 may generate electrical signals or data corresponding to an internal operating state of the mobile electronic device 100 or to an external environmental condition. The sensor modules 104 and 119 may include a first sensor module 104 (e.g., a proximity sensor) and/or a second sensor module (e.g., a fingerprint sensor) disposed on the first surface 110A of the housing 110, and/or a third sensor module 119 (e.g., a heart rate monitor (HRM) sensor) and/or a fourth sensor module (e.g., a fingerprint sensor) disposed on the second surface 110B of the housing 110. The fingerprint sensor may be disposed on the second surface 110B as well as the first surface 110A (e.g., the display 101) of the housing 110. The electronic device 100 may further include at least one of a gesture sensor, a gyro sensor, an air pressure sensor, a magnetic sensor, an acceleration sensor, a grip sensor, a color sensor, an infrared (IR) sensor, a biometric sensor, a temperature sensor, a humidity sensor, or an illuminance sensor.

The camera modules 105, 112 and 113 may include a first camera device 105 disposed on the first surface 110A of the electronic device 100, and a second camera device 112 and/or a flash 113 disposed on the second surface 110B. The camera module 105 or the camera module 112 may include one or more lenses, an image sensor, and/or an image signal processor. The flash 113 may include, for example, a light emitting diode or a xenon lamp. Two or more lenses (infrared cameras, wide angle and telephoto lenses) and image sensors may be disposed on one side of the electronic device 100.

The key input device 117 may be disposed on the lateral surface 110C of the housing 110. The mobile electronic device 100 may not include some or all of the key input device 117 described above, and the key input device 117 which is not included may be implemented in another form such as a soft key on the display 101. The key input device 117 may include the sensor module disposed on the second surface 110B of the housing 110.

The indicator 106 may be disposed on the first surface 110A of the housing 110. For example, the indicator may provide status information of the electronic device 100 in an optical form. The indicator may provide a light source associated with the operation of the camera module 105. The indicator may include, for example, a light emitting diode (LED), an IR LED, or a xenon lamp.

The connector holes 108 and 109 may include a first connector hole 108 adapted for a connector (e.g., a universal serial bus (USB) connector) for transmitting and receiving power and/or data to and from an external electronic device, and/or a second connector hole 109 adapted for a connector (e.g., an earphone jack) for transmitting and receiving an audio signal to and from an external electronic device.

Figure 3:
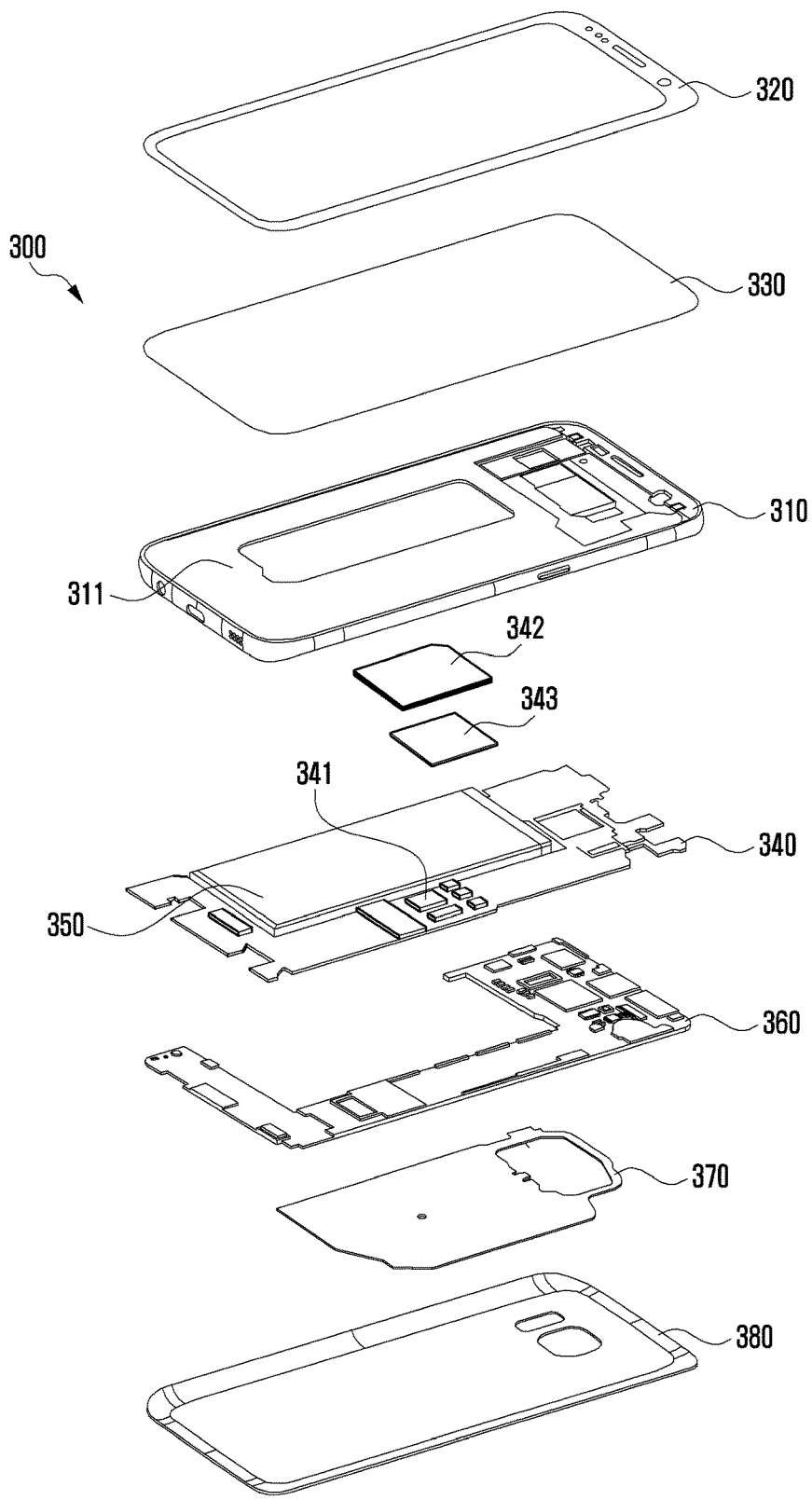
FIG. 3 is an exploded perspective view illustrating the electronic device of FIG. 1 according to various embodiments of the disclosure.

FIG. 3 illustrates an exploded perspective view showing a mobile electronic device shown in FIG. 1 according to an embodiment of the disclosure.

Referring to FIG. 3, a mobile electronic device 300 may include a lateral bezel structure 310, a first support member 311 (e.g., a bracket), a front plate 320, a display 330, an electromagnetic induction panel (not shown), a printed circuit board (PCB) 340, a battery 350, a second support member 360 (e.g., a rear case), an antenna 370, and a rear plate 380. The mobile electronic device 300 may omit at least one (e.g., the first support member 311 or the second support member 360) of the above components or may further include another component. Some components of the electronic device 300 may be the same as or similar to those of the mobile electronic device 100 shown in FIG. 1 or FIG. 2, thus, descriptions thereof are omitted below.

The first support member 311 is disposed inside the mobile electronic device 300 and may be connected to, or integrated with, the lateral bezel structure 310. The first support member 311 may be formed of, for example, a metallic material and/or a non-metal (e.g., polymer) material. The first support member 311 may be combined with the display 330 at one side thereof and also combined with the printed circuit board (PCB) 340 at the other side thereof. On the PCB 340, a processor, a memory, and/or an interface may be mounted. The processor may include, for example, one or more of a central processing unit (CPU), an application processor (AP), a graphics processing unit (GPU), an image signal processor (ISP), a sensor hub processor, or a communications processor (CP).

The memory may include, for example, one or more of a volatile memory and a non-volatile memory.

The interface may include, for example, a high definition multimedia interface (HDMI), a USB interface, a secure digital (SD) card interface, and/or an audio interface. The interface may electrically or physically connect the mobile electronic device 300 with an external electronic device and may include a USB connector, an SD card/multimedia card (MMC) connector, or an audio connector.

The battery 350 is a device for supplying power to at least one component of the mobile electronic device 300, and may include, for example, a non-rechargeable primary battery, a rechargeable secondary battery, or a fuel cell. At least a part of the battery 350 may be disposed on substantially the same plane as the PCB 340. The battery 350 may be integrally disposed within the mobile electronic device 300, and may be detachably disposed from the mobile electronic device 300.

The antenna 370 may be disposed between the rear plate 380 and the battery 350. The antenna 370 may include, for example, a near field communication (NEC) antenna, a wireless charging antenna, and/or a magnetic secure transmission (MST) antenna. The antenna 370 may perform short-range communication with an external device, or transmit and receive power required for charging wirelessly. An antenna structure may be formed by a part or combination of the lateral bezel structure 310 and/or the first support member 311.

According to various embodiments, at least one electric element 341 (e.g., an electronic component) may be mounted on the PCB 340. According to an embodiment, the at least one electric element 341 may include at least one processor and/or at least one surface mounting device (SMD) or surface mount technology (SMT) type chip that performs at least one particular function. According to an embodiment, the electric element 341 mounted on the PCB 340 may generate heat and noise. According to an embodiment, the electronic device 300 may include a shielding structure 342 (e.g., a shield can) which is a metal structure capable of dissipating heat generated by the electric element 341 to the outside and effectively shielding noise. According to an embodiment, the shielding structure 342 may be disposed to surround the electric element 341 on the PCB 340 through an automated process when the electronic device 300 is assembled, but there is a possibility of an electrical short due to the proximity to the electric element 341. Therefore, an insulating tape member 343 may be interposed between the electric element 341 and the shielding structure 342. According to an embodiment, the insulating tape member 343 electrically insulates the conductive shielding structure 342 from the electric element 341 so that a function of the electric element 341 is sufficiently expressed.

According to various embodiments, the insulating tape member 343 according to the disclosure may be attached to the shielding structure 342 through an automated process. In this case, the insulating tape member 343 may have a structure with reinforced rigidity so that it can be applied to a pickup process using a pneumatic pressure during the automated process without self-deformation even if a separate release paper is not used.

Hereinafter, the insulating tape member 343 will be described in detail.

Figure 4:
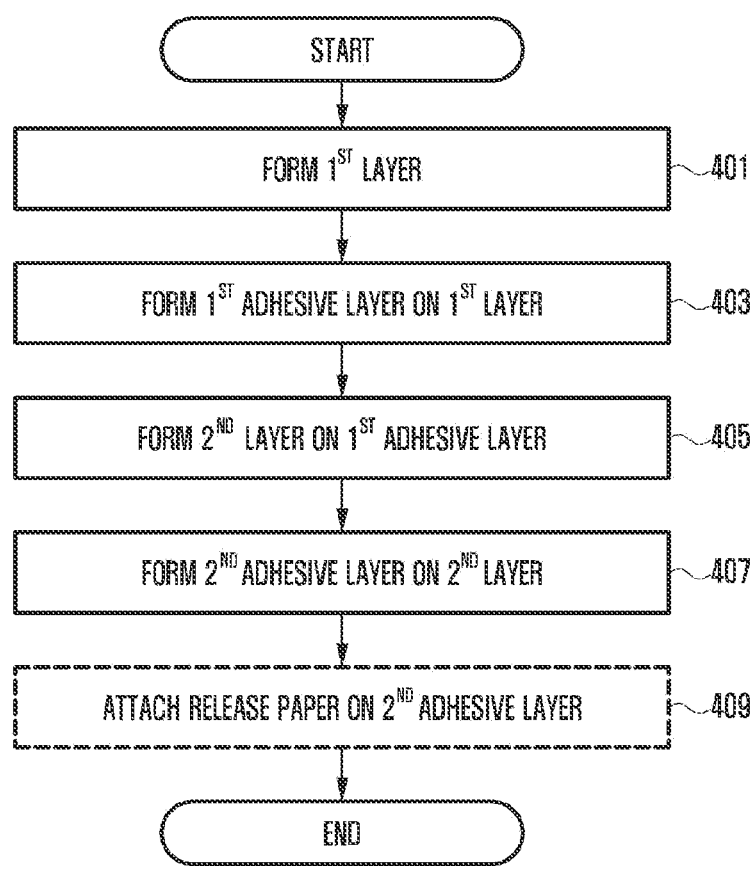
FIG. 4 is a process view illustrating a manufacturing process of an insulating tape member according to various embodiments of the disclosure.
Figure 5:
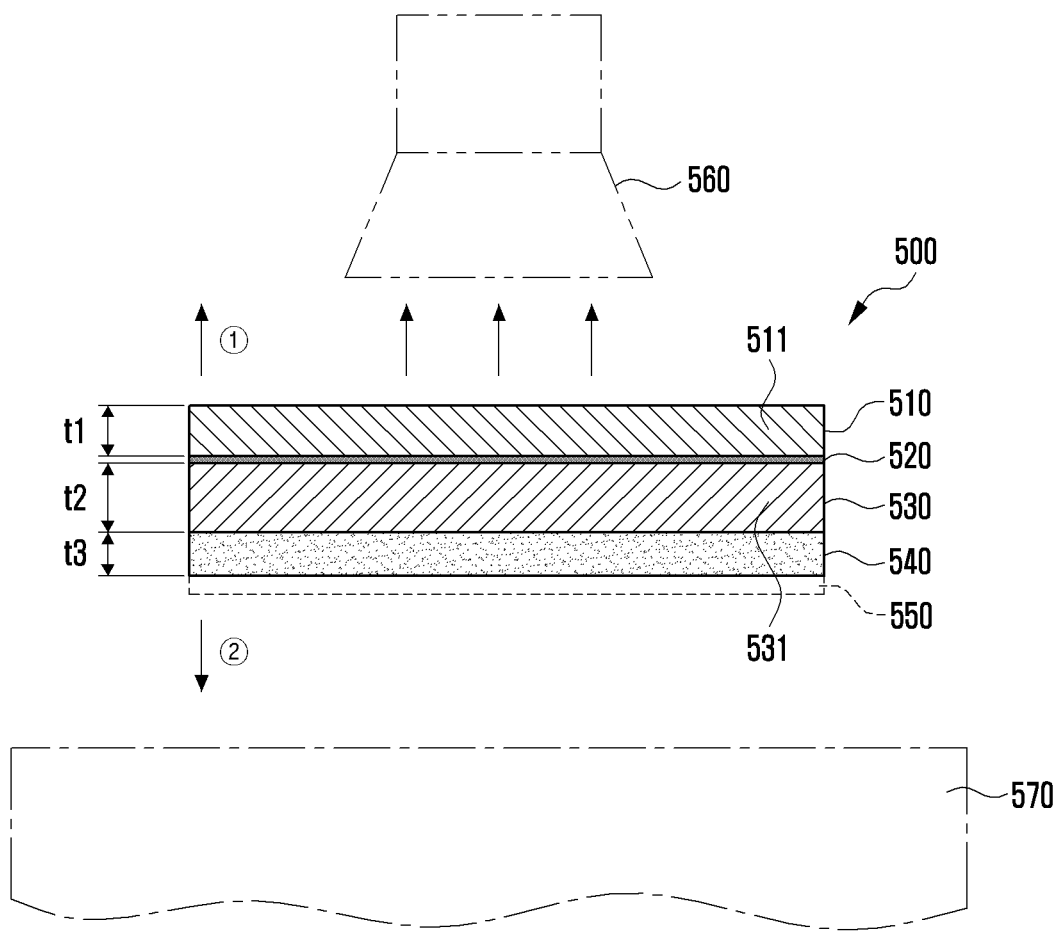
FIG. 5 is a cross-sectional view illustrating an insulating tape member manufactured through the process of FIG. 4 according to various embodiments of the disclosure.

FIG. 4 is a process view illustrating a manufacturing process of an insulating tape member according to various embodiments of the disclosure. FIG. 5 is a cross-sectional view illustrating an insulating tape member 500 manufactured through the process of FIG. 4 according to various embodiments of the disclosure.

The order of operations shown in FIG. 4 may be changed at least in part, or some operations may be omitted.

The insulating tape member 500 of FIG. 5 may be similar, at least in part, to the insulating tape member 343 of FIG. 3 or may include other embodiments of the insulating tape member.

Referring to FIGS. 4 and 5, at operation 401, a first layer 510 containing a first material 511 may be formed in a film form. According to an embodiment, the first layer 510 may be formed to have a first thickness t1. According to an embodiment, the first material 511 may include polyimide (PI) having excellent heat resistance. According to an embodiment, the first material may include at least one of polyethylene terephtalate (PET), polyolefine (PO), or polyethylene napthalate (PEN).

At operation 403, a first adhesive layer 520 may be formed on the first layer 510. According to an embodiment, the first adhesive layer 520 may include an adhesive material formed of at least one of acryl, silicone, or urethane.

At operation 405, a second layer 530 containing a second material 531 may be formed on the first adhesive layer 520 in a film form. According to an embodiment, the second layer 530 may be formed to have a second thickness t2 that is equal to or greater than the thickness of the first layer 510. According to an embodiment, the second layer 530 may be formed to be laminated with the first layer 510 by the first adhesive layer 520. According to an embodiment, the second material 531 may include polyimide (PI) having excellent heat resistance. According to an embodiment, the second material 531 may include at least one of polyethylene terephtalate (PET), polyolefine (PO), or polyethylene napthalate (PEN).

At operation 407, a second adhesive layer 540 may be formed with a third thickness t3 on the second layer 530. According to an embodiment, the second adhesive layer 540 may be formed to attach the insulating tape member 500 to a metal structure (e.g., the shielding structure 342 in FIG. 3) around an electric element (e.g., the electric element 341 in FIG. 3) of an electronic device (e.g., the electronic device 300 in FIG. 3) or to a boundary region (e.g., a conductive partition wall) between a certain electric element and an adjacent electric element. According to an embodiment, the second adhesive layer 540 may include a Si-based adhesive material (e.g., pressure sensitive adhesive (PSA)) having excellent heat resistance.

At operation 409, a release paper 550 may be attached on the second adhesive layer 540. For example, when the insulating tape member 500 is stored in a rolled state or laminated on a roller before being used in the electronic device (e.g., the electronic device 300 in FIG. 3), the release paper 550 can prevent unwanted adhesion between multiple wound layers of the insulating tape member. According to an embodiment, the release paper 550 may be formed as a film made of polyethylene terephtalate (PET). According to an embodiment, the release paper 550 may be removed before the automated process according to an embodiment of the disclosure.

According to various embodiments, the insulating tape member 500 may be formed in multiple layers. This is because the rigidity may increase compared to the insulating tape member formed of a single layer when formed in multiple layers. For example, when the rigidity of the multi-layered insulating tape member (e.g., a thickness ratio between a first layer and a second layer is 1:1) and the rigidity of the single-layered insulating tape member are measured respectively five times (the total thickness t is the same) as shown in Table 1 below, the multi-layered insulating tape member can withstand a greater load than the single-layered insulating tape member. This means that even if the total thickness is the same, the rigidity of the multi-layered insulating tape member is improved.

TABLE 1

| Film | Sample | 1st & 2nd layered tape member (total thickness: t) | Single-layered tape member (total thickness: t) |
|---|---|---|---|
| Load (gf) | #1 | 2.4640 | 1.4365 |
| | #2 | 2.2169 | 1.4074 |
| | #3 | 2.0221 | 1.8665 |

TABLE 1-continued

| Film | Sample | 1st & 2nd layered tape member (total thickness: t) | Single-layered tape member (total thickness: t) |
|---|---|---|---|
| | #4 | 2.1776 | 2.1820 |
| | #5 | 2.6607 | 2.4442 |
| | Average | 2.3083 | 1.8673 |

According to various embodiments, the insulating tape member 500 punched to fit a desired shape may be transferred to a structure 570 (e.g., a metal structure) in the electronic device (e.g., the electronic device 300 in FIG. 3) through the automated process and then attached to a corresponding location. In this case, the pickup machine 560 for transferring the insulating tape member 500 may use a pneumatic pressure (a vacuum pressure). According to an embodiment, the pickup machine 560 contacts at least a portion of the insulating tape member 500 through a suction surface thereof and transfers the insulating tape member 500 with a vacuum suction force, so that the insulating tape member 500 needs to maintain its shape without deformation when picked up or transported. According to an embodiment, in order to prevent deformation during transport, the insulating tape member 500 may be formed so that an upper layer in a pickup direction (denoted by ①) has a smaller thickness. In other words, the insulating tape member 500 may be formed so that a lower layer in a direction (denoted by ②) attached to the structure 570 has a greater thickness. This is to withstand occurring forces because when a portion of the insulating tape member 500 sucked by the pickup machine 560 is pulled upward, a tensile force being downward occurs around the sucked portion, and a compressive force occurs on the opposite side of the sucked portion. Therefore, the first thickness t1 of the first layer 510 may be smaller than the second thickness t2 of the second layer 530. According to an embodiment, the insulating tape member 500 may be formed as a thin film having a total thickness of 5 μm to 150 μm.

According to various embodiments, while the insulating tape member 500 maintains its total thickness and a laminated structure composed of layers having gradually decreased, or unchanged, thicknesses toward the pickup direction (denoted by ①), the first layer 510, the second layer 530, and the second adhesive layer 540 may be variously changed in thickness. For example, while maintaining the total thickness of the insulating tape member 500 at 50 μm, the thicknesses of the first layer 510, the second layer 530, and the second adhesive layer 540 may be 12.5 μm, 25 μm, and 12.5 μm, respectively. In another embodiment, the thicknesses of the first layer 510, the second layer 530, and the second adhesive layer 540 may be 5 μm, 25 μm, and 20 μm, respectively. In still another embodiment, the thicknesses of the first layer 510, the second layer 530, and the second adhesive layer 540 may be 7.5 μm, 25 μm, and 17.5 μm, respectively. In yet another embodiment, the thicknesses of the first layer 510, the second layer 530, and the second adhesive layer 540 may be 12.5 μm, 12.5 μm, and 25 μm, respectively.

Figure 6:
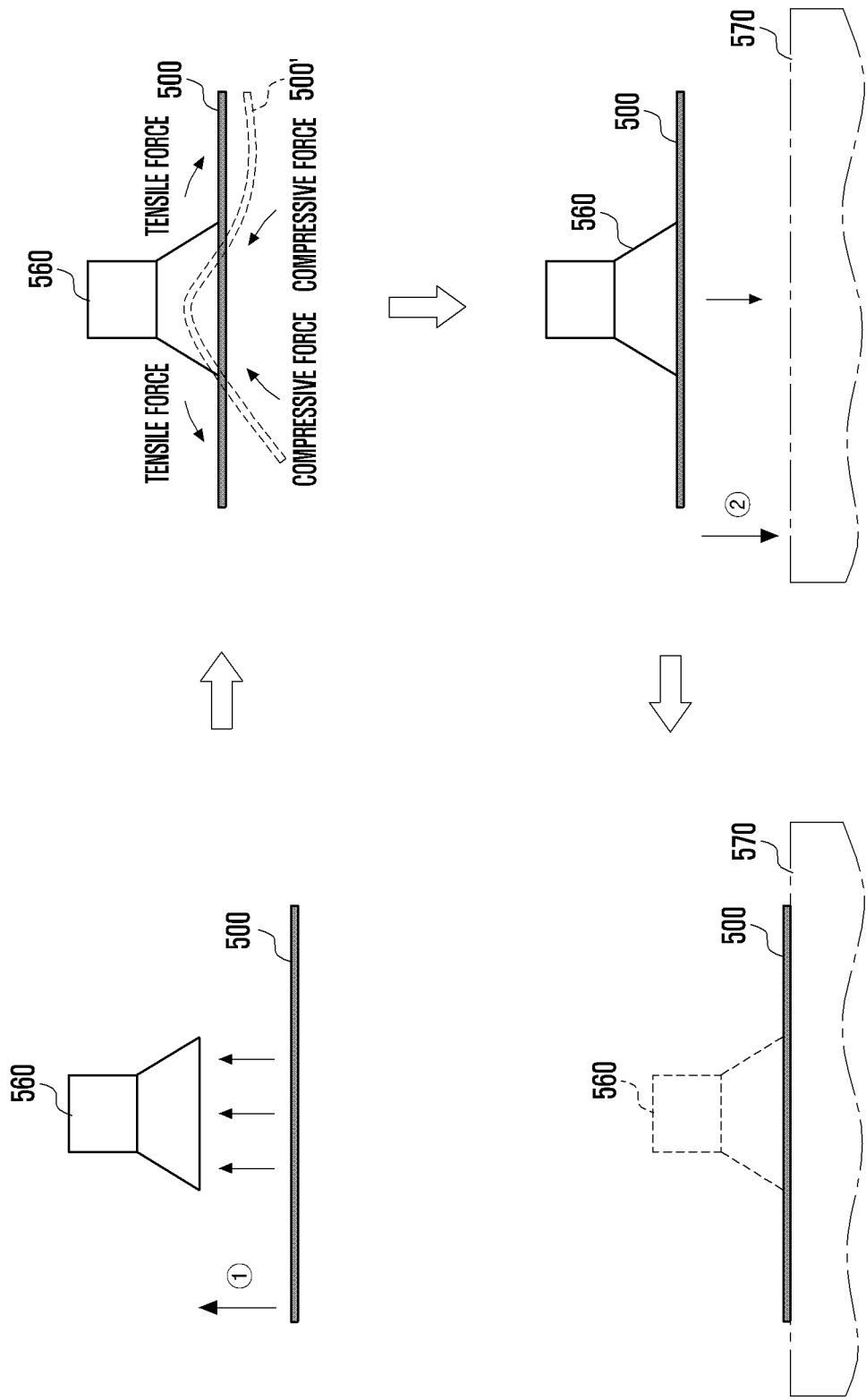
FIG. 6 is a schematic view illustrating a process sequence of attaching an insulating tape member to an electronic device in an automated process according to various embodiments of the disclosure.

FIG. 6 is a schematic view illustrating a process sequence of attaching the insulating tape member 500 to the structure 570 of the electronic device (e.g., the electronic device 100 in FIG. 1) in an automated process according to various embodiments of the disclosure.

Referring to FIG. 6, the pickup machine 560 may pick up the insulating tape member 500 in an upward direction. According to an embodiment, the insulating tape member 500 may be punched into a shape corresponding to a target position of the electronic device to be attached, and the release paper may be removed before the transport of the pickup machine 560. According to an embodiment, as shown, even if the insulating tape member 500 is lifted in a state sucked by the pickup machine 560, the insulating tape member 500 formed in a multi-layer structure may maintain its shape without deformation unlike a conventional insulating tape member 500' formed in a single-layer structure. According to an embodiment, the insulating tape member 500 may be transferred above and then lowered to the target structure 570 of the electronic device (e.g., the electronic device 100 in FIG. 1) by the pickup machine, and attached to the structure 570.

Figure 7A:
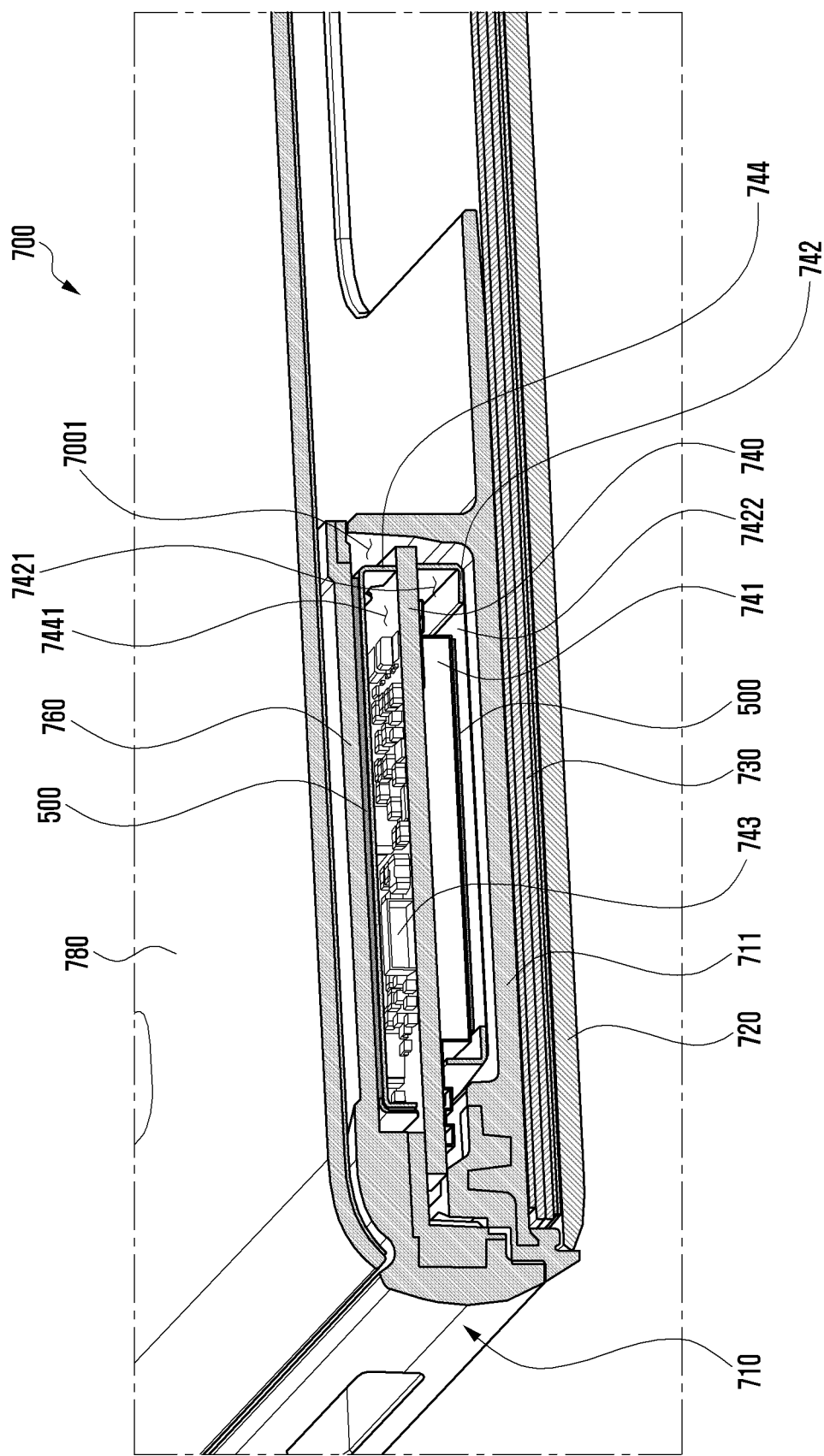
FIGS. 7A to 7C are views illustrating states in which an insulating tape member according to various embodiments of the disclosure is applied to various parts of an electronic device.
Figure 7B:
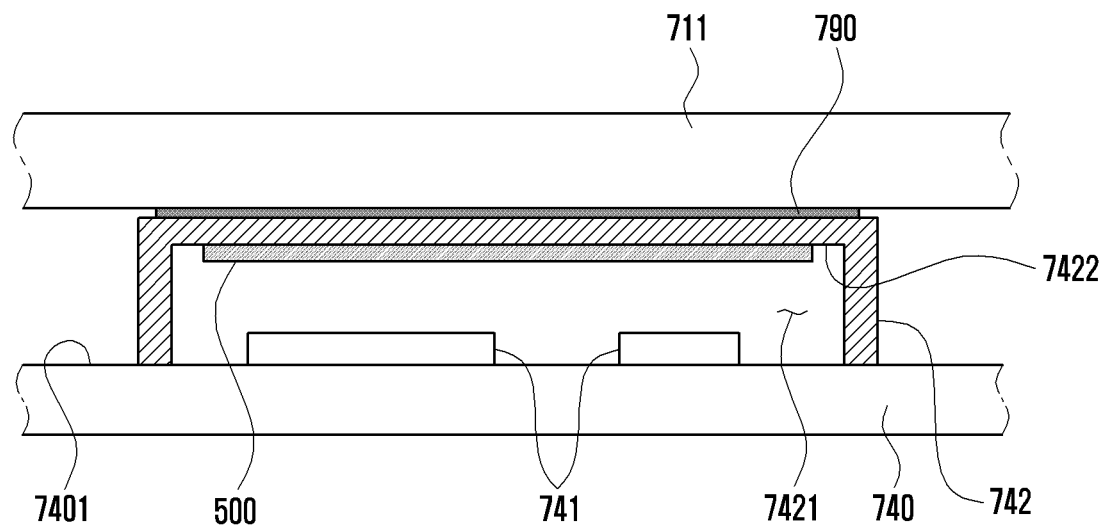
Figure 7C:
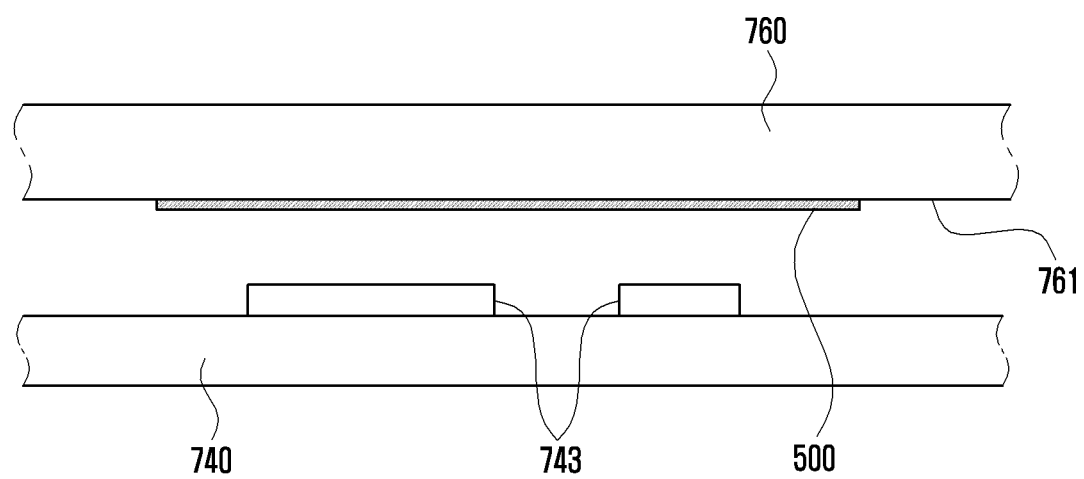

FIGS. 7A to 7C are views illustrating states in which an insulating tape member 500 according to various embodiments of the disclosure is applied to various parts of an electronic device 700. FIG. 7A is a cross-sectional view taken along line A-A' of FIG. 2B.

The electronic device 700 of FIG. 7A may be similar, at least in part, to the electronic device 300 of FIG. 3, or may include other embodiments of the electronic device.

Referring to FIGS. 7A and 7B, the electronic device 700 may include a housing that includes a first plate 720 (e.g., the front plate 102 in FIG. 1), a second plate 780 (e.g., the rear plate 111 in FIG. 2) facing the opposite direction of the first plate 720, and a lateral member 710 (e.g., a lateral bezel structure or a lateral support structure) (e.g., the lateral bezel structure 310 in FIG. 3) surrounding a space 7001 between the first plate 720 and the second plate 780. According to an embodiment, the electronic device 700 may include a display 730 (e.g., the display 101 in FIG. 1) (e.g., a flexible display) exposed to the outside through at least a portion of the first plate 720. According to an embodiment, the electronic device 700 may include a first support structure 711 (e.g., the first support member 311 in FIG. 3) (e.g., a bracket) extended from the lateral member 710 into the space 7001. In an embodiment, the first support structure 711 may be integrally formed with the lateral member 710 through insert injection. In another embodiment, the first support structure 711 may be structurally combined with the lateral member 710. According to an embodiment, the first support structure 711 may include, at least in part, a conductive region (e.g., a metal member region). According to an embodiment, the electronic device 700 may include a printed circuit board (PCB) 740 disposed in the space 7001. According to an embodiment, the electronic device 700 may include a plurality of electric elements 741 and 743 mounted on the PCB 740 between the PCB 740 and the first support structure 711 and/or between the PCB 740 and a second support structure 760. According to an embodiment, the electronic device 700 may include a shield can 742 as a shielding structure that is mounted on one surface 7401 of the PCB 740 between the PCB 740 and the first support member 711 and surrounds at least one 741 of the electric elements to shield noise. According to an embodiment, another shield can 744 may be also disposed between the PCB 740 and the second support structure 760 to provide an inner space 7441 for shielding the electric element 743.

According to various embodiments, the shield can 742 provided to surround the electric element 741 may be disposed at a position very close to the electric element 741 due to the slimness of the electronic device 700. Therefore, the insulating tape member 500 according to the disclosure may be interposed between the shield can 742 and the electric element 741 for electrical insulation. According to an embodiment, the insulating tape member 500 may be disposed in a manner of being attached to an inner surface 7422 of the shield can 742 in a space 7421 between the shield can 742 and the PCB. According to an embodiment, the electronic device (e.g., the electronic device 700 in FIG. 7A) may include a thermally conductive member 790 disposed between the shield can 742 and the first support structure 711. According to an embodiment, the thermally conductive member 790 may include a thermal interface material (TIM) for dissipating heat delivered from the shield can 742 to the first support structure 711 made of a metal material.

As shown in FIG. 7C, the insulating tape member 500 may be disposed at various positions in the electronic device 700. For example, the insulating tape member 500 may be applied for electrically insulating the electric elements 743 mounted on the PCB 740 from the second support member 760 between the PCB 740 and the second support member 760. In this case, the insulating tape member 500 may be attached to a surface 761 of the second support member 760 facing the electric element 743.

Figure 8:
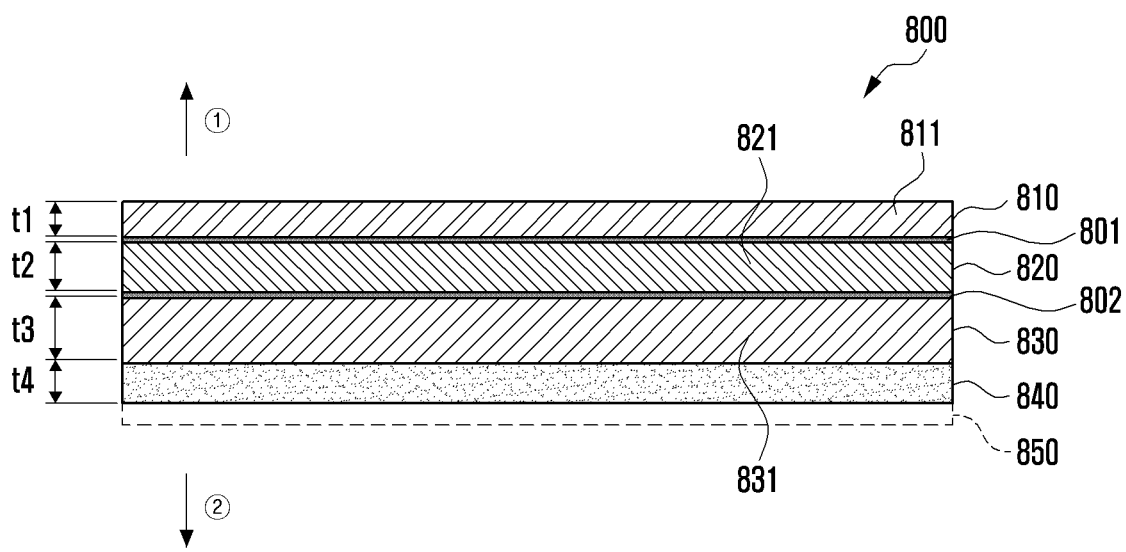
FIG. 8 is a cross-sectional view illustrating an insulating tape member according to various embodiments of the disclosure.

FIG. 8 is a cross-sectional view illustrating an insulating tape member 800 according to various embodiments of the disclosure.

The insulating tape member 800 of FIG. 8 may be similar, at least in part, to the insulating tape member 343 of FIG. 3, or may include other embodiments of the insulating tape member.

Referring to FIG. 8, the insulating tape member 800 may include a first layer 810 containing a first material 811, a first adhesive layer 801 formed on the first layer 810, a second layer 820 containing a second material 821 and formed on the first adhesive layer 801, a second adhesive layer 802 formed on the second layer 820, a third layer 830 containing a third material 831 and formed on the second adhesive layer 802, a third adhesive layer 840 formed on the third layer 830, and a release layer 850 formed on the third adhesive layer 840.

According to various embodiments, the first layer 810 may be formed to have a first thickness t1. According to an embodiment, the second layer 820 may be formed to have a second thickness t2 that is equal to or greater than the thickness of the first layer 810. According to an embodiment, the third layer 830 may be formed to have a third thickness t3 that is equal to or greater than the thickness of the second layer 820. According to an embodiment, the third adhesive layer 840 may be formed to have a fourth thickness t4. According to an embodiment, the first material 811, the second material 821, or the third material 831 may include polyimide (PI) having excellent heat resistance. According to an embodiment, the first material 811, the second material 821, or the third material 831 may include at least one of polyethylene terephtalate (PET), polyolefine (PO), or polyethylene napthalate (PEN). According to an embodiment, the first layer 810, the second layer 820, and the third layer 830 may be formed to be laminated with each other by the first adhesive layer 801 and the second adhesive layer 802. According to an embodiment, the first adhesive layer 801 and the second adhesive layer 802 may include an adhesive material formed of at least one of acryl, silicone, or urethane. According to an embodiment, the third adhesive layer 840 may be formed to attach the insulating tape member 800 to a metal structure (e.g., the shielding structure 342 in FIG. 3) around an electric element (e.g., the electric element 341 in FIG. 3) of an electronic device (e.g., the electronic device 300 in FIG. 3) or to a boundary region (e.g., a conductive partition wall) between a certain electric element and an adjacent electric element. According to an embodiment, the third adhesive layer 840 may include a Si-based adhesive material (e.g., pressure sensitive adhesive (PSA)) having excellent heat resistance. According to an embodiment, when the insulating tape member 800 is stored in a rolled state or laminated on a roller before being used in the electronic device (e.g., the electronic device 300 in FIG. 3), the release layer 850 can prevent unwanted adhesion between multiple wound layers of the insulating tape member. According to an embodiment, the release layer 850 may be formed as a film made of polyethylene terephtalate (PET). According to an embodiment, the release layer 850 may be removed before an automated process according to the disclosure.

According to various embodiments, while the insulating tape member 800 maintains its total thickness and a laminated structure composed of layers having gradually decreased, or unchanged, thicknesses toward a pickup direction (denoted by ①), the first layer 810, the second layer 820, the third layer 830, and the third adhesive layer 840 may be variously changed in thickness. For example, while maintaining the total thickness of the insulating tape member 800 at 50 µm, the thicknesses of the first layer 810, the second layer 820, the third layer 830, and the third adhesive layer 840 may be 5 µm, 7.5 µm, 12.5 µm, and 25 µm, respectively. In another embodiment, the thicknesses of the first layer 810, the second layer 820, the third layer 830, and the third adhesive layer 840 may be 5 µm, 7.5 µm, 25 µm, and 12.5 µm, respectively. In still another embodiment, the thicknesses of the first layer 810, the second layer 820, the third layer 830, and the third adhesive layer 840 may be 7.5 µm, 12.5 µm, 12.5 µm, and 17.5 µm, respectively. In yet another embodiment, while maintaining the total thickness of the insulating tape member at 100 µm, more various laminated layers may be further added.

According to various embodiments, by implementing different adhesive properties of the first and second adhesive layers 801 and 802, the insulating tape member 800 can be further prevented from being deformed during pickup. According to an embodiment, the adhesive layers 801 and 802 may have a softer type adhesive property toward a pickup direction (denoted by ①). For example, the second adhesive layer 802 may be formed to have a harder type adhesive property with a modulus property greater than that of the first adhesive layer 801.

According to various embodiments of the disclosure, the insulating tape member (e.g., the insulating tape member 343 in FIG. 3, the insulating tape member 500 in FIG. 5, or the insulating tape member 800 in FIG. 8) may not only have the two-layer structure of FIG. 5 or the three-layer structure of FIG. 8 in which a layer thickness increases toward a direction (denoted by ②) attached to a surrounding structure, but also have any other laminated structure of four or more layers if there is no limit to the total thickness of the insulating tape member.

According to various embodiments, the insulating tape member (e.g., the insulating tape member 343 in FIG. 3, the insulating tape member 500 in FIG. 5, or the insulating tape member 800 in FIG. 8) may perform various functions as well as the insulation function by using at least one laminated layer. For example, the at least one layer may contain a material having a heat resistance function or an electromagnetic wave blocking function as well as an insulating function.

According to various embodiments, the insulating tape member formed of multiple layers (e.g., the insulating tape member 343 in FIG. 3, the insulating tape member 500 in FIG. 5, or the insulating tape member 800 in FIG. 8) may have an improved scratch resistance because, even if a certain layer is damaged, the structure is protected by the next layer.

Figure 9:
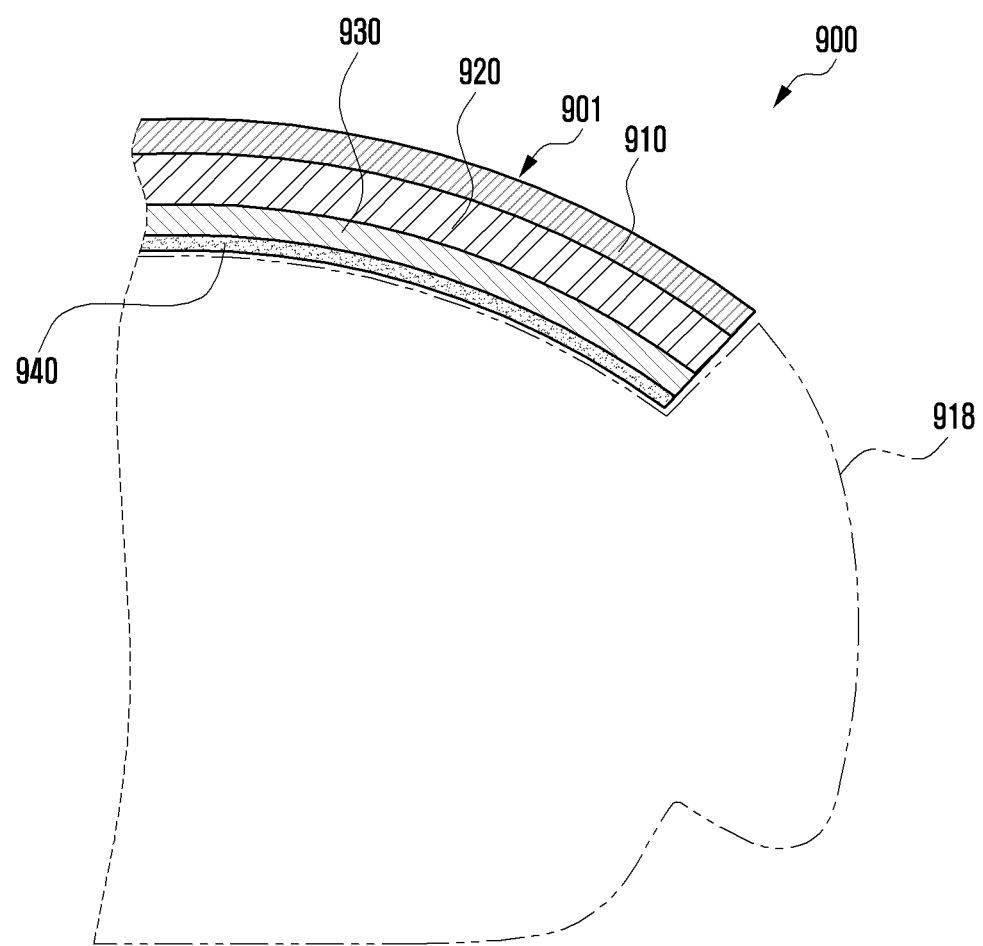
FIG. 9 is a cross-sectional view taken along the line A-A' of FIG. 1 to illustrate a front plate according to various embodiments of the disclosure.

FIG. 9 is a cross-sectional view taken along the line A-A' of FIG. 1 to illustrate a front plate according to various embodiments of the disclosure.

An electronic device 900 of FIG. 9 may be similar, at least in part, to the electronic device 100 of FIG. 1 or the electronic device 700 of FIG. 7A, or may include other embodiments of the electronic device.

Referring to FIG. 9, a multilayered structure of the above-described insulating tape member according to embodiments of the disclosure may be applied to a front plate 901 (e.g., the front plate 102 in FIG. 1) of the electronic device 900. According to an embodiment, such a multilayered structure may be applied to a curved region (e.g., the first region 110D in FIG. 1 or the second region 110E in FIG. 2) of the front plate 901.

According to various embodiments, the front plate 901 may include a first layer 910 forming an exterior of the electronic device 900, a second layer 920 laminated on the first layer 910, a third layer 930 laminated on the second layer 920, and an adhesive layer 940 laminated on the third layer 930 and attached to a housing structure 918 (e.g., the lateral bezel structure 118 in FIG. 1) of the electronic device 900. According to an embodiment, the first layer 910 which is in contact with external environments of the electronic device 900 may be formed of a relatively hard and thin glass or film material. According to an embodiment, similar to the first layer 910, the third layer 930 may also be formed of a hard glass or film material. According to an embodiment, the second layer 920 may be formed of a relatively soft and thick material having impact resistance. Therefore, the front plate 901 has a thicker lamination structure as it is closer to the adhesive layer, and this may improve strength through improvement of brittleness and/or ductility and also improve dimensional precision through improvement of thermoforming, cooling, or spring back phenomenon according to shear stress interaction with an interlayer bonding surface.

According to various embodiments, an electronic device (e.g., the electronic device 300 in FIG. 3) may comprise a housing (e.g., the housing 310 in FIG. 3) including a first plate (e.g., the front plate 320 in FIG. 3), a second plate (e.g., the rear plate 380 in FIG. 3) facing in an opposite direction to the first plate, and a lateral member surrounding a space between the first plate and the second plate; a printed circuit board (PCB) (e.g., the PCB 340 in FIG. 3) disposed in the space and having at least one electric element (e.g., the electric element 341 in FIG. 3) mounted thereon; a shield can (e.g., the shield can 342 in FIG. 3) mounted on the PCB and disposed to surround the at least one electric element; and an insulating tape member (e.g., the insulating tape member 343 in FIG. 3) attached to an inner surface of the shield can between the shield can and the electric element. The insulating tape member (e.g., the insulating tape member 500 in FIG. 5) may include a first layer (e.g., the first layer 510 in FIG. 5) containing a first material (e.g., the first material 511 in FIG. 5) and formed to have a first thickness (e.g., the first thickness t1 in FIG. 5), a second layer (e.g., the second layer 530 in FIG. 5) laminated on the first layer with an adhesive (e.g., the first adhesive layer 520 in FIG. 5), containing a second material (e.g., the second material 531 in FIG. 5), and formed to have a second thickness (e.g., the second thickness t2 in FIG. 5) equal to or greater than the first thickness, and an adhesive layer (e.g., the second adhesive layer 540 in FIG. 5) formed on the second layer and attached to the shield can.

According to various embodiments, the first material and/or the second material may include at least one of polyimide (PI), polyethylene terephtalate (PET), polyolefine (PO), or polyethylene napthalate (PEN).

According to various embodiments, the adhesive may include an adhesive material formed of at least one of acryl, silicone, or urethane.

According to various embodiments, the adhesive layer may include a Si-based adhesive material.

According to various embodiments, a release layer (e.g., the release paper 550 in FIG. 5) formed on the adhesive layer may be further included, and the release layer may be removed before the insulating tape member is applied to an automated process.

According to various embodiments, the release layer may be formed as a film made of polyethylene terephtalate (PET).

According to various embodiments, the insulating tape member may be formed to have a thickness of about 5 μm to about 150 μm.

According to various embodiments, a flexible display (e.g., the display 330 in FIG. 3) disposed in the space and exposed to an outside through at least a portion of the first plate may be further included.

According to various embodiments, an electronic device (e.g., the electronic device 700 in FIG. 7A) may comprise a housing including a first plate (e.g., the first plate 720 in FIG. 7A), a second plate (e.g., the second plate 780 in FIG. 7A) facing in an opposite direction to the first plate, and a lateral member (e.g., the lateral member 710 in FIG. 7A) surrounding a space (e.g., the space 7001 in FIG. 7A) between the first plate and the second plate; at least one electric element (e.g., the electric element 743 in FIG. 7A) disposed in the space; a metal structure (e.g., the second support member 760 in FIG. 7A) disposed around the at least one electric element in the space; and an insulating tape member (e.g., the insulating tape member 500 in FIG. 7A) attached to the metal structure between the at least one electric element and the metal structure. The insulating tape member (e.g., the insulating tape member 500 in FIG. 5) may include a first layer (e.g., the first layer 510 in FIG. 5) containing a first material (e.g., the first material 511 in FIG. 5) and formed to have a first thickness (e.g., the first thickness t1 in FIG. 5), a second layer (e.g., the second layer 530 in FIG. 5) laminated on the first layer with an adhesive (e.g., the first adhesive layer 520 in FIG. 5), containing a second material (e.g., the second material 531 in FIG. 5), and formed to have a second thickness (e.g., the second thickness t2 in FIG. 5) equal to or greater than the first thickness, and an adhesive layer (e.g., the second adhesive layer 540 in FIG. 5) formed on the second layer and attached to the metal structure.

According to various embodiments, the first material and/or the second material may include at least one of polyimide (PI), polyethylene terephtalate (PET), polyolefine (PO), or polyethylene napthalate (PEN).

According to various embodiments, the adhesive may include an adhesive material formed of at least one of acryl, silicone, or urethane.

According to various embodiments, the adhesive layer may include a Si-based adhesive material.

According to various embodiments, the metal structure may include a conductive support member or bracket extended from the lateral member into the space.

According to various embodiments, a printed circuit board (PCB) disposed in the space and having at least one electric element mounted thereon may be further included, and the metal structure may include a shield can mounted on the PCB to surround the at least one electric element.

According to various embodiments, the insulating tape member may be formed to have a thickness of about 5 μm to about 150 μm.

According to various embodiments, a flexible display disposed in the space and exposed to an outside through at least a portion of the first plate may be further included.

According to various embodiments, an electronic device (e.g., the electronic device 100 in FIG. 1) may comprise a housing (e.g., the housing 110 in FIG. 1) including a first plate (e.g., the front plate 102 in FIG. 1) and a second plate (e.g., the rear plate 111 in FIG. 2) facing in an opposite direction to the first plate; a printed circuit board (PCB) (e.g., the PCB 740 in FIG. 7B) disposed in the housing and having a first surface (e.g., the one surface 7401 in FIG. 7B); at least one electronic component (e.g., the electric element 741 in FIG. 7B) mounted on the first surface of the PCB; a conductive shield structure (e.g., the shield can 742 in FIG. 7B) mounted on the first surface of the PCB to cover the electronic component while being spaced apart from the electronic component, and having a second surface (e.g., the inner surface 7422 in FIG. 7B) facing the first surface; and an insulating member (e.g., the insulating tape member 500 in FIG. 7B) disposed between the second surface and the electronic component and attached to the second surface. The insulating member may include, in a direction from the second surface toward the first surface, a first adhesive layer (e.g., the second adhesive layer 540 in FIG. 5), a first polyimide film layer (e.g., the second layer 530 in FIG. 5) having a first thickness (e.g., the second thickness t2 in FIG. 5), a second adhesive layer (e.g., the first adhesive layer 520 in FIG. 5), and a second polyimide film layer (e.g., the first layer in FIG. 5) having a second thickness (e.g., the first thickness t1 in FIG. 5). The first thickness may be equal to or greater than the second thickness.

According to various embodiments, the first thickness may range from 5 μm to 150 μm.

According to various embodiments, the first thickness may be formed to be 1 to 5 times the second thickness.

According to various embodiments, the total thickness of the insulating member may be in the range of 5 μm to 150 μm.

While the disclosure has been described in detail with reference to specific embodiments, it is to be understood that various changes and modifications may be made without departing from the scope of the disclosure. In addition, the above-described embodiments may be selectively combined with each other if necessary. For example, some of the embodiments proposed in the disclosure may be combined with each other and used by a base station and a terminal.

The invention claimed is:

1. An electronic device comprising:
   a housing including a first plate, a second plate facing in an opposite direction to the first plate, and a lateral member surrounding a space between the first plate and the second plate;
   a printed circuit board (PCB) disposed in the space and having at least one electric element mounted thereon;
   a shield can mounted on the PCB and disposed to surround at least in part the at least one electric element; and
   an insulating tape member attached to an inner surface of the shield can between the shield can and the electric element, and including:
      a first layer containing a first material and formed to have a first thickness;

a second layer laminated on the first layer with an adhesive, containing a second material, and formed to have a second thickness equal to or greater than the first thickness; and an adhesive layer formed on the second layer and attached to the shield can.

2. The electronic device of claim 1, wherein the first material and/or the second material includes at least one of polyimide (PI), polyethylene terephtalate (PET), polyolefine (PO), or polyethylene napthalate (PEN).

3. The electronic device of claim 1, wherein the adhesive includes an adhesive material formed of at least one of acryl, silicone, or urethane.

4. The electronic device of claim 1, wherein the adhesive layer includes a Si-based adhesive material.

5. The electronic device of claim 1, further comprising:

a release layer formed on the adhesive layer, wherein the release layer is removed before the insulating tape member is applied to an automated process.

6. The electronic device of claim 4, wherein the release layer is formed as a film made of polyethylene terephtalate (PET).

7. The electronic device of claim 1, wherein the insulating tape member is formed to have a thickness of about 5 μm to about 150 μm.

8. The electronic device of claim 1, further comprising:

a flexible display disposed in the space and exposed to an outside through at least a portion of the first plate.

9. An electronic device comprising:

a housing including a first plate, a second plate facing in an opposite direction to the first plate, and a lateral member surrounding a space between the first plate and the second plate;

at least one electric element disposed in the space;

a metal structure disposed around the at least one electric element in the space; and an insulating tape member attached to the metal structure between the at least one electric element and the metal structure, and including:

a first layer containing a first material and formed to have a first thickness;

a second layer laminated on the first layer with an adhesive, containing a second material, and formed to have a second thickness equal to or greater than the first thickness; and an adhesive layer formed on the second layer and attached to the metal structure.

10. The electronic device of claim 9, wherein the first material and/or the second material includes at least one of polyimide (PI), polyethylene terephtalate (PET), polyolefine (PO), or polyethylene napthalate (PEN).

11. The electronic device of claim 9, wherein the adhesive layer includes a Si-based adhesive material.

12. The electronic device of claim 9, wherein the metal structure includes a conductive support member or bracket extended from the lateral member into the space.

13. The electronic device of claim 9, further comprising:

a printed circuit board (PCB) disposed in the space and having at least one electric element mounted thereon, wherein the metal structure includes a shield can mounted on the PCB to surround the at least one electric element.

14. The electronic device of claim 9, wherein the insulating tape member is formed to have a thickness of about 5 μm to about 150 μm.

15. The electronic device of claim 9, further comprising:

a flexible display disposed in the space and exposed to an outside through at least a portion of the first plate.

* * * * *